United States Patent [19]

Keesen et al.

[11] Patent Number: 5,410,308
[45] Date of Patent: Apr. 25, 1995

[54] SYSTEM FOR PROCESSING A DIGITAL SIGNAL INCLUDING AUXILIARY DATA TO FACILITATE DATA RECONSTITUTION AT A DECODER

[75] Inventors: Heinz W. Keesen, Hanover; Herbert Schütze, Celle; Dieter Haupt, Hanover, all of Germany

[73] Assignee: Deutsche Thomson-Brandt GmbH, Villengen-Schwenningen, Germany

[21] Appl. No.: 50,772

[22] Filed: Apr. 22, 1993

[30] Foreign Application Priority Data

Oct. 24, 1990 [DE] Germany ............... 40 33 815.0

[51] Int. Cl.⁶ .................... H03M 7/40; H04N 7/12
[52] U.S. Cl. ........................... 341/60; 341/67; 348/408; 348/423
[58] Field of Search .............. 341/60, 65, 67; 348/399, 408, 419, 437, 438, 439, 423

[56] References Cited

U.S. PATENT DOCUMENTS

| | | | |
|---|---|---|---|
| 4,907,101 | 3/1990 | Keesen et al. | 360/48 |
| 4,985,766 | 1/1991 | Morrison et al. | 348/419 |
| 5,047,852 | 9/1991 | Hanyu et al. | 348/408 |
| 5,138,315 | 8/1992 | Le Queau et al. | 341/67 |
| 5,302,949 | 4/1994 | Yoshinari et al. | 341/67 |

FOREIGN PATENT DOCUMENTS

| | | |
|---|---|---|
| 0385654 | 9/1990 | European Pat. Off. |
| 3702490 | 8/1988 | Germany |
| 3736898 | 5/1989 | Germany |

Primary Examiner—Howard L. Williams
Attorney, Agent, or Firm—Joseph S. Tripoli; Eric P. Herrmann; Ronald H. Kurdyla

[57] ABSTRACT

A block of picture elements is DCT transformed and coded to produce a corresponding data block of variable length codewords having an average length. The data blocks are apportioned among fixed length transport blocks as needed to produce full transport blocks. The transport blocks include a direct (DC) component and alternating components at prescribed locations, as well as an address information flag indicating whether or not block data is longer or shorter than the average length, and an address pointer, to facilitate recovery and synchronization of apportioned data blocks at a decoder.

9 Claims, 10 Drawing Sheets

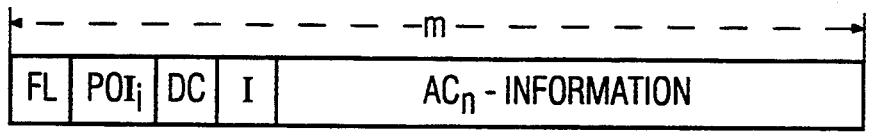

| FL | ADDRESS INFORMATION FLAG |
|---|---|
| $POI_j$ | ADDRESS POINTER INFORMATION |
| DC | DC COEFFICIENT |
| I | 8x8/4x8 IDENTIFICATION |
| $AC_n$ | AC INFORMATION OF THE CURRENT BLOCK |

$FL = 0$
$POI_j = (POI_{j-1} + l_n - m)$

FIG. 2

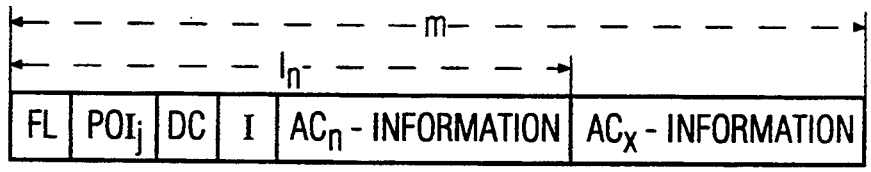

| FL | ADDRESS INFORMATION FLAG |
|---|---|
| $POI_j$ | ADDRESS POINTER INFORMATION |
| DC | DC COEFFICIENT |
| I | 8x8/4x8 IDENTIFICATION |
| $AC_n$ | AC INFORMATION OF THE CURRENT BLOCK |
| $AC_x$ | AC INFORMATION FROM OTHER BLOCKS |

$FL = 1$
$POI_j = (POI_{j-1} + m - l_n)$ $l_n$ = LENGTH OF CODED DCT BLOCK
$m$ = AVERAGE BLOCK LENGTH

FIG. 3

| BLOCK NO. | FL | POI | DATA | m |
|---|---|---|---|---|
| 1 | DC | 1 | 15 | |
| 2 | DC | 0 | 50 | |
| 3 | DC | 0 | 75 | |
| 4 | DC | 1 | 50 | |
| 5 | DC | 1 | 85 | |
| 6 | DC | 1 | 120 | |
| 7 | DC | 1 | 163 | |
| 8 | DC | 0 | 292 | |
| 9 | DC | 0 | 472 | |
| 10 | DC | 0 | 535 | |
| 11 | DC | 0 | 558 | |
| 12 | DC | 0 | 593 | |
| 13 | DC | 0 | 668 | |
| 14 | DC | 1 | 195 | |
| 15 | DC | 1 | 208 | |
| 16 | DC | 0 | 703 | |
| 17 | DC | 1 | 238 | |
| 18 | DC | 1 | 248 | |
| 19 | DC | 0 | 808 | |
| 20 | DC | 0 | 928 | |
| 21 | DC | 0 | 963 | |
| 22 | DC | 1 | 273 | |
| 23 | DC | 1 | 308 | |
| 24 | DC | 1 | 338 | |
| 25 | DC | 1 | 358 | |
| 26 | DC | 0 | 1153 | |
| 27 | DC | 1 | 388 | |
| 28 | DC | 1 | 423 | |
| 29 | DC | 1 | 443 | |
| 30 | DC | 0 | 1178 | |
| 31 | DC | 0 | 1183 | |
| 32 | DC | 1 | 478 | |
| 33 | DC | 1 | 513 | |
| 34 | DC | 1 | 528 | |
| 35 | DC | 1 | 563 | |
| 36 | DC | 1 | 588 | |
| 37 | DC | 1 | 643 | |
| 38 | DC | 1 | 698 | |
| 39 | DC | 1 | 753 | |
| 40 | DC | 1 | 808 | |
| 41 | DC | 1 | 863 | |
| 42 | DC | 1 | 918 | |
| 43 | DC | 1 | 973 | |
| 44 | DC | 1 | 1028 | |
| 45 | DC | 1 | 1083 | |
| 46 | DC | 1 | 1138 | |
| 47 | DC | 1 | 1193 | |
| 48 | DC | 1 | 1248 | |

FIG. 6

| FL. | POI$_j$ | POI$_i$ | LENGTH AC$_n$ | | LENGTH AC$_x$ |
|---|---|---|---|---|---|
| 1 | 15 | | 75 − 15 | = 60 | 15 − 0 = 15 |
| 0 | | 50 | 75 − | = 75 | 0 |
| 0 | | 75 | 75 − | = 75 | 0 |
| 1 | 50 | | 75 − 50 + 15 | = 40 | 50 − 15 = 35 |
| 1 | 85 | | 75 − 85 + 50 | = 40 | 85 − 50 = 35 |
| 1 | 120 | | 75 − 120 + 85 | = 40 | 120 − 85 = 35 |
| 1 | 163 | | 75 − 163 + 120 | = 32 | 163 − 120 = 43 |
| 0 | | 292 | 75 | = 75 | 0 |
| 0 | | 472 | 75 | = 75 | 0 |
| 0 | | 535 | 75 | = 75 | 0 |
| 0 | | 558 | 75 | = 75 | 0 |
| 0 | | 593 | 75 | = 75 | 0 |
| 0 | | 668 | 75 | = 75 | 0 |
| 1 | 195 | | 75 − 195 + 163 | = 43 | 0 |
| 1 | 208 | | 75 − 208 + 195 | = 62 | 195 − 163  32 |
| 0 | | 703 | 75 | 75 | 208 − 195  13 |
| 1 | 238 | | | 45 | 0 |
| 1 | 248 | | | 65 | 30 |
| 0 | | 808 | 75 | 75 | 10 |
| 0 | | 928 | 75 | 75 | 0 |
| 0 | | 963 | 75 | 75 | 0 |
| 1 | 273 | | | 50 | 0 |
| 1 | 308 | | | 40 | 25 |
| 1 | 335 | | | 45 | 35 |
| 1 | 358 | | | 55 | 30 |
| 0 | | 1153 | 75 | 75 | 20 |
| 1 | 388 | | | 45 | 0 |
| 1 | 423 | | | 40 | 30 |
| 1 | 443 | | | 55 | 35 |
| 0 | | 1178 | 75 | 75 | 20 |
| 0 | | 1183 | 75 | 75 | 0 |
| 1 | 478 | | | 40 | 0 |
| 1 | 513 | | | 40 | 35 |
| 1 | 528 | | | 60 | 35 |
| 1 | 563 | | | 40 | 15 |
| 1 | 588 | | | 50 | 35 |
| 1 | 643 | | | 20 | 25 |
| 1 | 698 | | | 20 | 55 |
| 1 | 753 | | | 20 | 55 |
| 1 | 808 | | | 20 | 55 |
| 1 | 863 | | | 20 | 55 |
| 1 | 918 | | | 20 | 55 |
| 1 | 973 | | | 20 | 55 |
| 1 | 1028 | | | 20 | 55 |
| 1 | 1083 | | | 20 | 55 |
| 1 | 1138 | | | 20 | 55 |
| 1 | 1193 | | | 20 | 55 |
| 1 | 1248 | | | 20 | 55 |

FIG. 9

| FL. | POI$_j$ | POI$_i$ | LENGTH AC$_n$ | LENGTH AC$_x$ |
|---|---|---|---|---|
| 1 | 15 | | 75 − 15 = 60 | 15 − 0 = 15 |
| 0 | | 50 | 75 − = 75 | 0 |
| 0 | | 75 | 75 − = 75 | 0 |
| 1 | 50 | | 75 − 50 + 15 = 40 | 50 − 15 = 35 |
| 1 | 85 | | 75 − 85 + 50 = 40 | 85 − 50 = 35 |
| 1 | 120 | | 75 − 120 + 85 = 40 | 120 − 85 = 35 |
| 1 | 163 | | 75 − 163 + 120 = 32 | 163 − 120 = 43 |
| 0 | | 292 | 75 = 75 | 0 |
| 0 | | 472 | 75 = 75 | 0 |
| 0 | | 535 | 75 = 75 | 0 |
| 0 | | 558 | 75 = 75 | 0 |
| 0 | | 593 | 75 = 75 | 0 |
| *1 | | ~~868~~ 178 | 75 = ~~75~~ 60 | ~~0~~ 15 |
| 1 | ~~195~~ 209 | | 75 − ~~195 + 163~~ = ~~43~~ 44 | 195 − 163  ~~32~~ 31 |
| *0 | ~~208~~ 792 | | 75 − 208 + 195 = 62 | 208 − 195  13 |
| 0 | | 703 | 75  75 | 0 |
| 1 | 238 | | ~~45~~ 46 | ~~30~~ 29 |
| 1 | 248 | | 65 | 10 |
| 0 | | 808 | 75  75 | 0 |
| 0 | | 928 | 75  75 | 0 |
| 0 | | 963 | 75  75 | 0 |
| 1 | 273 | | 50 | 25 |
| 1 | 308 | | 40 | 35 |
| 1 | 338 | | 45 | 30 |
| 1 | 358 | | 55 | 20 |
| 0 | | 1153 | 75  75 | 0 |
| 1 | 388 | | 45 | 30 |
| 1 | 423 | | 40 | 35 |
| 1 | 443 | | 55 | 20 |
| 0 | | 1178 | 75  75 | 0 |
| 0 | | 1183 | 75  75 | 0 |
| 1 | 478 | | 40 | 35 |
| 1 | 513 | | 40 | 35 |
| 1 | 528 | | 60 | 15 |
| 1 | 563 | | 40 | 35 |
| 1 | 588 | | 50 | 25 |
| 1 | 643 | | 20 | 55 |
| 1 | 698 | | 20 | 55 |
| 1 | 753 | | 20 | 55 |
| 1 | 808 | | 20 | 55 |
| 1 | 863 | | 20 | 55 |
| 1 | 918 | | 20 | 55 |
| 1 | 973 | | 20 | 55 |
| 1 | 1028 | | 20 | 55 |
| 1 | 1083 | | 20 | 55 |
| 1 | 1138 | | 20 | 55 |
| 1 | 1193 | | 20 | 55 |
| 1 | 1248 | | 20 | 55 |

SYSTEM FOR PROCESSING A DIGITAL SIGNAL INCLUDING AUXILIARY DATA TO FACILITATE DATA RECONSTITUTION AT A DECODER

This is a continuation of PCT application PCT/EP 91/01954 filed Oct. 15, 1991 by Heinz-Werner Keesen et al., titled "Method, Coder and Decoder for Data Transmission and/or Storage".

FIELD OF THE INVENTION

The invention concerns coder/decoder method and apparatus for data transmission.

BACKGROUND OF THE INVENTION

In German Patent DE 37 02 490, a data transmission method is described in which data from picture element (pixel) blocks is converted from a DCT (discrete cosine transformation) into digital signals which are coded with variable word lengths. In doing this, the digital signals are recorded in blocks with an average length. Blocks which are not completely full are filled up with data from other blocks. In order to improve (i.e., reduce) interference susceptibility, direct DC components and significant alternating AC components are recorded at fixed intervals. If faults occur in the transmission channel or in the storage medium, block data which is distributed over other blocks cannot be decoded.

SUMMARY OF THE INVENTION

The method and apparatus according to the present invention permits data transmission and/or storage such that, in the case of transmission faults for example, the decoding of block data which is distributed over other blocks is possible.

In accordance with the principles of the invention, data at the coder is converted into variable length data blocks and are assigned to transport blocks of constant, average word length using memory devices, for example. Selected data components from the digital signal segments, in particular a DC component and significant AC components with their associated addresses, are arranged in each of the transport blocks. Transport blocks containing data blocks with a shorter than average word length are filled with data from data blocks with a longer than average word length. At a decoder, the data blocks are retrieved in their original, differing word lengths using memory devices, for example. Every transport block contains an address information flag and address pointer information. In the presence of faults in transmission and/or reading in the decoding process, the flags and pointers indicate from which addresses the data from data blocks with a longer than average word length can be retrieved and utilized for decoding.

By this process, digital signals can contain coded DCT coefficients, and transport blocks with constant, average word length can contain information indicating which type of DCT coefficients are included in the digital signals for the respective block. Blocks with or without AC components from other blocks are marked accordingly using the address information flag.

A preferred embodiment of coding apparatus according to the present invention shown in FIG. 4 comprises a coding circuit (1) which converts input data into digital signals with variable word lengths (ln), and a downstream multiplexer (2) which forms transport blocks with constant, average word length (m) together with downstream first storage devices (3, 4). Selected data components from digital signal segments, in particular a direct DC component and significant AC components (ACn) with their associated addresses, are stored in the first memories for each of these blocks. Transport blocks containing data from data blocks with a shorter than average word length are filled with data segments (ACx) partitioned from data blocks with a longer than average word length. A demultiplexer (5) downstream from the storage devices bundles data belonging to a particular data block and transmits it to an output path (6). A circuit for address pointer calculation (13) which receives data from the first storage devices controls the multiplexer, and the demultiplexer and provides an address information flag (FL) and address pointer information (POI) for each block to the first storage devices.

Decoding apparatus comprises an address pointer decoder (7) downstream of output path (6) for separating and transmitting address pointer information and address information flags to a circuit for address pointer calculation (14). A multiplexer (8) downstream from the address pointer decoder, together with downstream second storage network (9, 10), retrieves data blocks in their original varying word lengths. A downstream demultiplexer (11) bundles data belonging to a particular data block and transmits the data block to a variable length decoder (12), at whose output data corresponding to the source data is available. The circuit for address pointer calculation (14) controls the multiplexer and the demultiplexer, and provides address pointer information for each block to the second storage network.

Transport blocks of picture element data can maintain an average length of "m" bits by means of known methods of adaptive quantization. This average number of m bits is called the average block length. Upon transmission or recording, the blocks are arranged so that the start of each block is positioned at a fixed distance (raster) from the average block length.

Every transport block is provided with an address information flag, address pointer information, and a direct voltage component at a predetermined point. Using this supplementary information, improved resynchronization can be achieved in the event of a fault in that alternating components distributed over other transport blocks can be properly decoded.

BRIEF DESCRIPTION OF THE DRAWINGS

FIG. 2 depicts a transport block according to the invention.

FIG. 3 illustrates another form of transport block according to the invention.

FIG. 6 depicts data in dual port RAM F I X 3 in FIG. 4.

FIG. 9 depicts data channel information.

FIG. 10 depicts data channel information in the presence of faults.

DESCRIPTION OF THE PREFERRED EMBODIMENTS

Restricting data transmission or recording capacity to an average information density through temporal data compression/expansion, i.e., through variable word lengths for data segments depending on the data information density, is generally advantageous. However, a problem of re-identifying the variable length data segments after transmission or recording may arise. This re-identification may be especially difficult if interference removes or obscures information needed for re-identification. It may happen that, even after the interference has passed, proper recognition of following data segments is difficult or impossible to achieve.

Accordingly, temporal compression and expansion of data segments is combined with a fixed time-slot raster whereby transport blocks whose full capacity is not used by the allocated data segments are filled by other data segments, for more efficient utilization. Thus data completeness is provided, and the time-slot raster enables the data segments to be subsequently re-identified through the allocation to the blocks. Consequently, the influence of interference is reduced.

Figure 1:
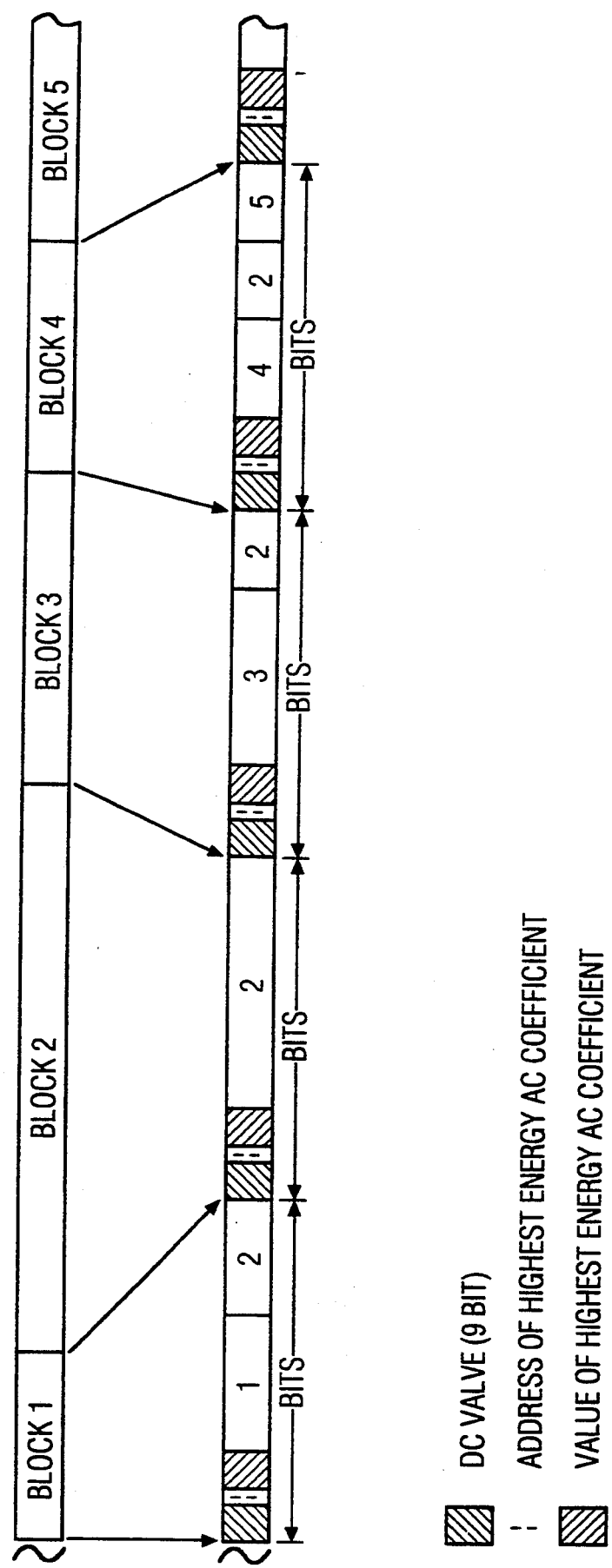
FIG. 1 depicts data and transport blocks provided by block DCT coding with variable word length.

Block data is represented pictorially in FIG. 1. In the upper part of the FIGURE a series of data blocks of different lengths is illustrated. The lower part of FIG. 1 shows that the transport blocks have a predetermined word length, and each contains a DC voltage component ('DC value') at the beginning of the block, an address for the largest AC component ('address of highest energy AC coefficient') within the associated block, and the largest AC component itself ('value of highest energy AC coefficient'). Each transport block also contains further significant AC components and their associated addresses. The numbers illustrated specify, respectively, from which data block (in the upper half of FIG. 1) the residual AC components in the transport blocks originate.

Several blocks can be combined into a frame and, within this frame, the total word length of the data segments prior to filling up the blocks can be made to coincide with the total word length of the blocks. This coinciding can consist of an enlargement of or a reduction in the original word lengths of the data segments. In doing this, the sum of the word lengths of the data segments is, at the most, equal to the sum of the word lengths of the blocks. Thus the word lengths of available blocks can be used optimally, without loss of important information. For example, every eight transport blocks may form a group. The $AC_x$ data is then inserted between the end of the eighth block and the end of the group. That is, the corresponding $AC_x$ data of all of these eight blocks are arranged together at the end of the group. Within each group, the value "m" can be modified so as to fill the group in an optimum manner.

With the inventive approach according to FIG. 2 and FIG. 3, supplementary information is added to each transport block in order to be able to decode the encoded block structure in the case of faults. Apart from the DC component and information about associated AC components ACn, each transport block n also contains an address information flag FL and an address pointer information POI. In addition, an identification flag "I" can specify whether the block was coded with an 8×8 DCT or with a doubled 4×8 DCT. An 8×8 DCT may be advantageously used for coding static image information, and a 2×(4×8) DCT for coding dynamic image information in interlace picture signals.

FIG. 2 pertains to a transport block configuration in which the amount of data required exceeds the average data block length. In these transport blocks, address information flag FL is set to '0'. The address pointer information POIi for the current block is calculated from the address pointer information POIi-1 of the preceding block with FL=0 in that the length of the block to be coded (n) is added on and the average block length (m) is subtracted. Following this, index i is incremented by "1".

Transport blocks containing data blocks which are shorter than or equal to average block length m, or which contain AC components ACx from one or more other blocks, have a structure according to FIG. 3. With these transport blocks, address information flag FL is set to '1'. The address pointer information POIj for the current transport block is calculated from the address pointer information POIj-1 of the preceding transport block with FL=1, in that the average data block length m is added on and the length In of the coded data block "n" is subtracted. Following this, index j is incremented by '1'.

The average block length "m" depends on the capacity of the channel. For example, in the case of processing picture elements (pixels) in a television signal processing system, if the channel video capacity is 30 Mb/s, the field frequency is 60 Hz and the number of 8×8 pixel blocks is 2700, "m" is equal to 185 bits (30÷60÷2700). In this example FL, POI, DC and 'I' all have a fixed bit length. The following bit lengths can be used, for example:

FL: 1, POI: 9, DC: 9, I: 1.

Figure 4:
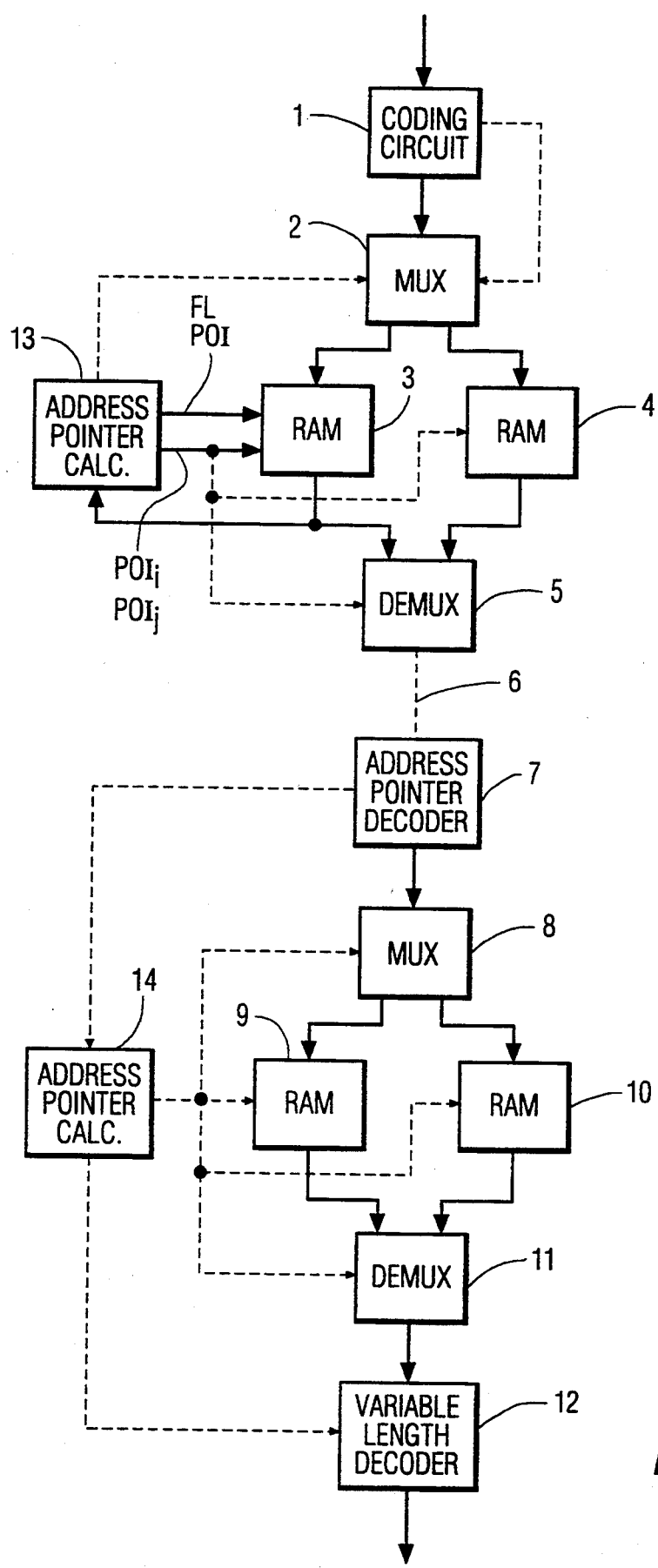
FIG. 4 is a block diagram of coder and decoder apparatus according to the invention.

FIG. 4 is a block diagram of a coder and decoder system in which data transmission or storage can be realized according to the invention. In a coding circuit 1, for example, DCT-transformed picture data is quantized, Huffman-coded and provided with addresses for AC components. Depending on the resulting data block lengths, a downstream multiplexer 2 apportions the block data between dual port RAMs 3 and 4. Address information flag FL and address pointer information POI are written into a dual port RAMF I X 3 as data information for every block, by means of an address pointer calculation circuit 13. Address pointer information POI can also be regarded as address information for dual port RAMV A R 4. The index FIX designates fixed data, and the index VAR designates the residual AC components. Address information flag FL indicates whether the data block is longer or shorter than the average block length m. For data blocks which are longer than m, POIi specifies up to which address has been written with data at dual port RAMV A R 4. For data blocks which are shorter than m, POIj specifies up to which address data, belonging to other data blocks, is read out from dual port RAMV A R 4. Afterwards, a demultiplexer 5 recombines block data from the dual port RAMs, and the data is provided to output path 6, e.g., a transmission channel or storage medium.

Decoder apparatus which receives the data from path 6 performs the inverse of the operation performed by encoder elements 1–5 and 13. Using information decoded by an address pointer decoding circuit 7, a circuit for the address pointer calculation 14 provides the address information required by a dual port RAMV A R 10. Address information flag FL indicates whether the current transport block contains a data block which is longer or shorter than average data block length m. At the decoder, pointer POIi specifies the addresses up to which data is read out from dual port RAMV A R 10 toward a variable length decoder 12, which provides the inverse of the function provided by coding circuit 1 at the encoder. Pointer POIj indicates up to which address data is written into dual port RAMV A R 10.

As in the encoder, a dual port RAMF I X 9 is arranged between multiplexer 8 and demultiplexer 11 in the decoder. A corresponding multiplexer 8 is situated between RAMs 9 and 20 and address pointer decoder 7, and a corresponding demultiplexer 11 is situated between RAMs 9 and 10 and variable length decoder 12.

Other storage (memory) devices can be used instead of dual port RAMs.

Figure 5:
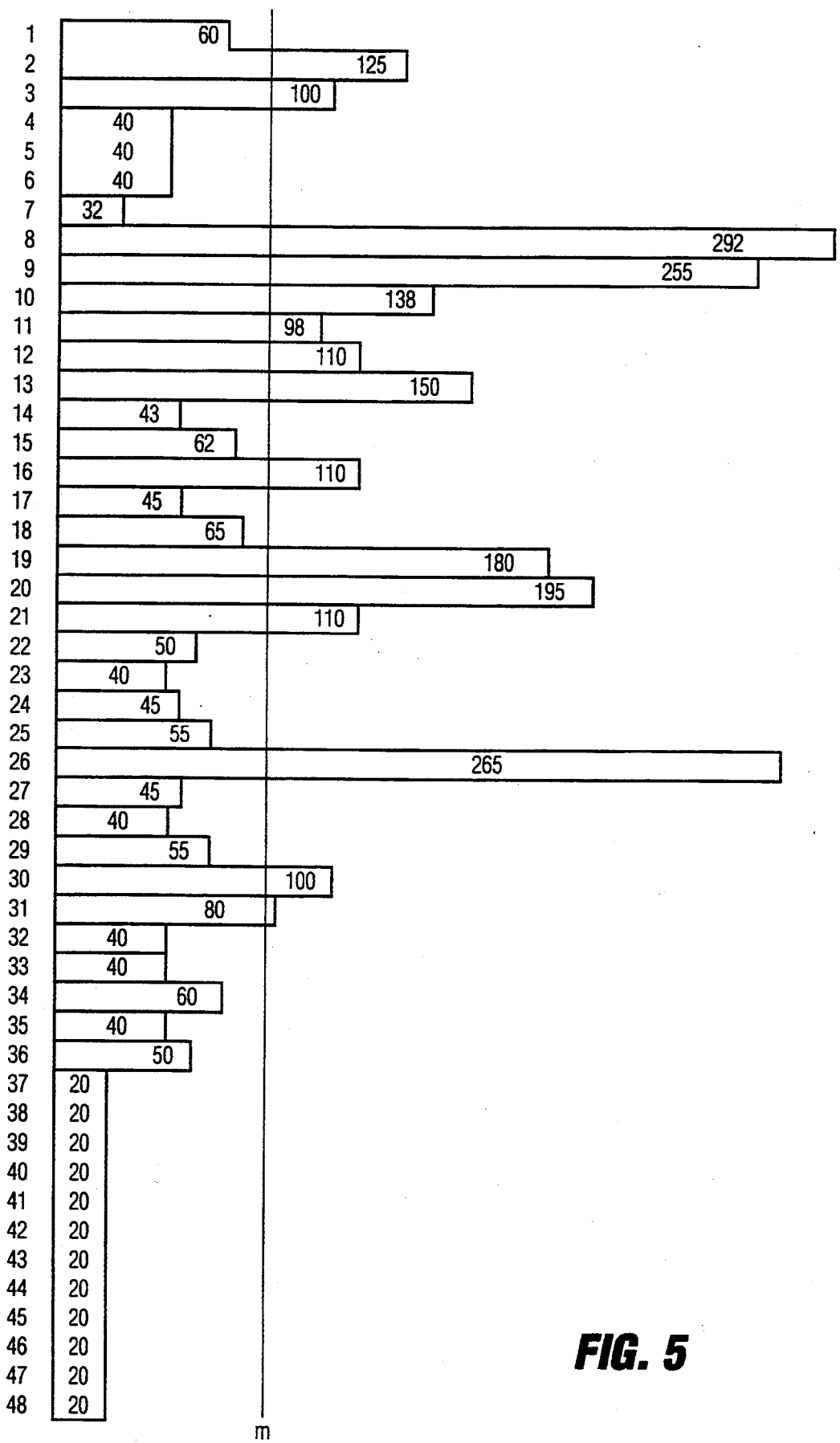
FIG. 5 illustrates DCT data blocks provided as input data for coding circuit 1 in FIG. 4.

FIG. 5 shows 48 DCT data blocks as input data for coding circuit 2. The actual word length is shown numerically, and the average data block word length m is indicated.

FIG. 6 shows the resulting data contents of dual port RAMF I X 3 with the respective values of n, FL and POI.

Figure 7:
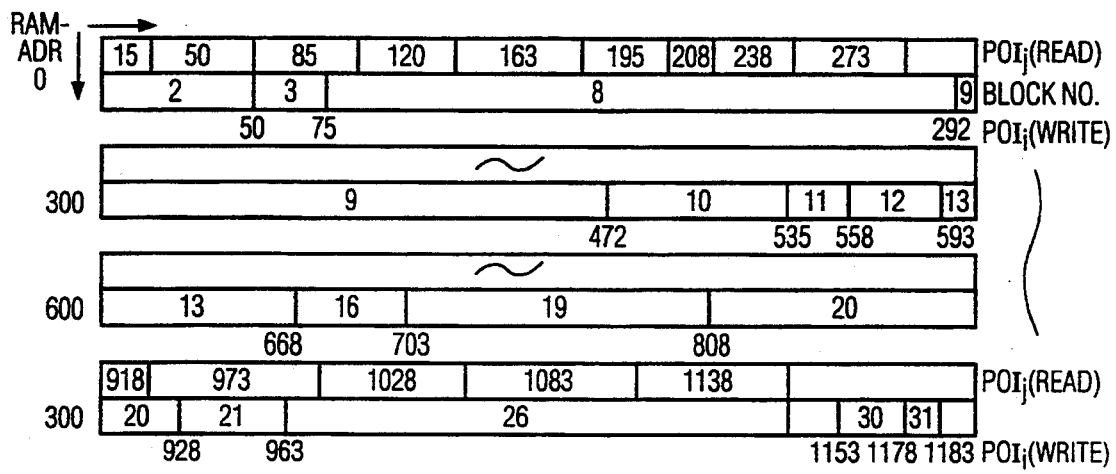
FIG. 7 depicts data in dual port RAM V A R 4 in FIG. 4.

FIG. 7 shows the contents of dual port RAMV A R 4 in the coder section. POIj for reading, block number n and POIj for writing, are indicated above the RAM addresses.

Figure 8:
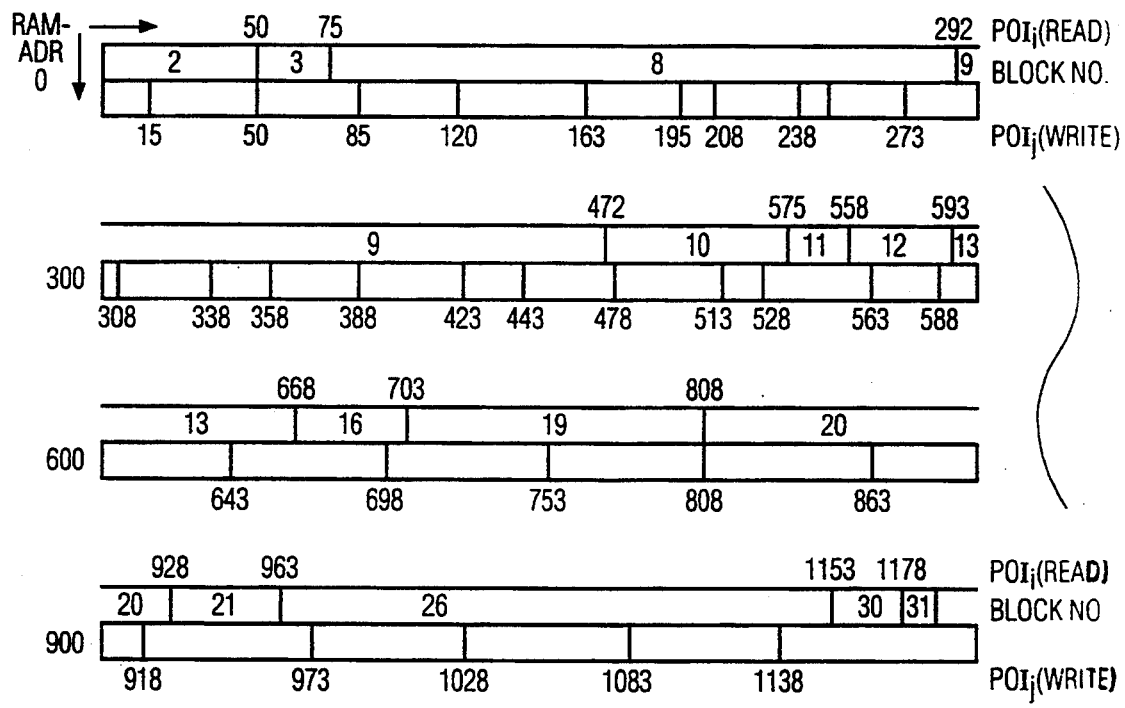
FIG. 8 depicts data in dual port RAM V A R 10 in FIG. 4.

FIG. 8 shows the contents of dual port RAMV A R 10 in the decoder section. POIj for reading, block number n and POIj for writing, are indicated above the RAM addresses.

FIG. 9 shows the resulting information of output path 6 with the values for FL, POIj, POIi and lengths of ACn and ACx components.

Figure 13:
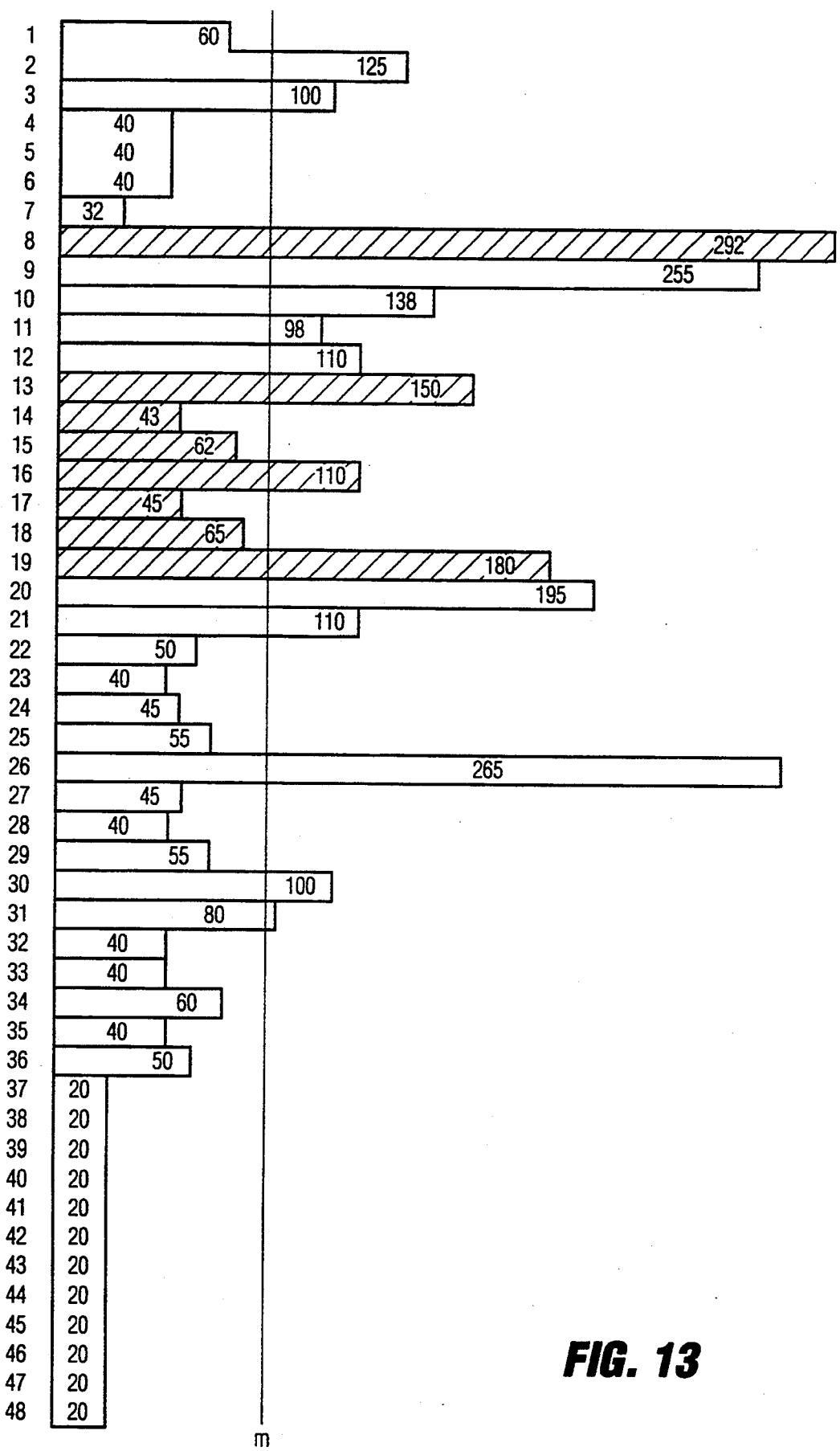
FIG. 13 depicts DCT data blocks as input data to coding circuit 1 of FIG. 4 in the case of faults.

FIG. 13 shows the 48 DCT data blocks from FIG. 5, but in the presence of a fault. Again, the actual word length is shown numerically, and the average word length m is indicated. Blocks incorrectly transmitted or read are shown hatched (e.g., blocks 9, 13, etc.).

FIG. 10 shows the illustration corresponding to FIG. 9 in the presence of a fault. Correspondingly altered values are written alongside the values for the fault-free case which are crossed out.

Figure 11:
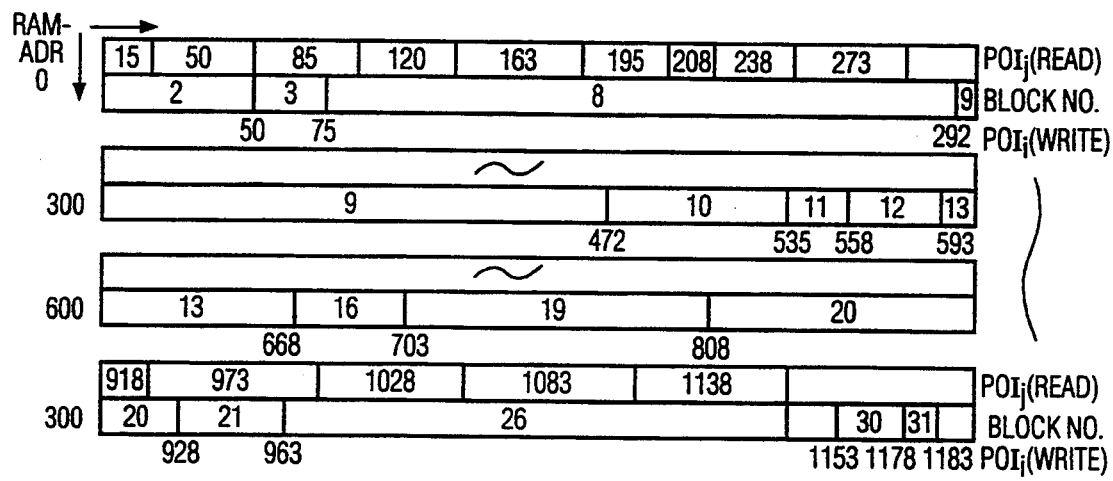
FIG. 11 depicts data in dual port RAMV A R 4 (FIG. 4) in the case of faults.
Figure 12:
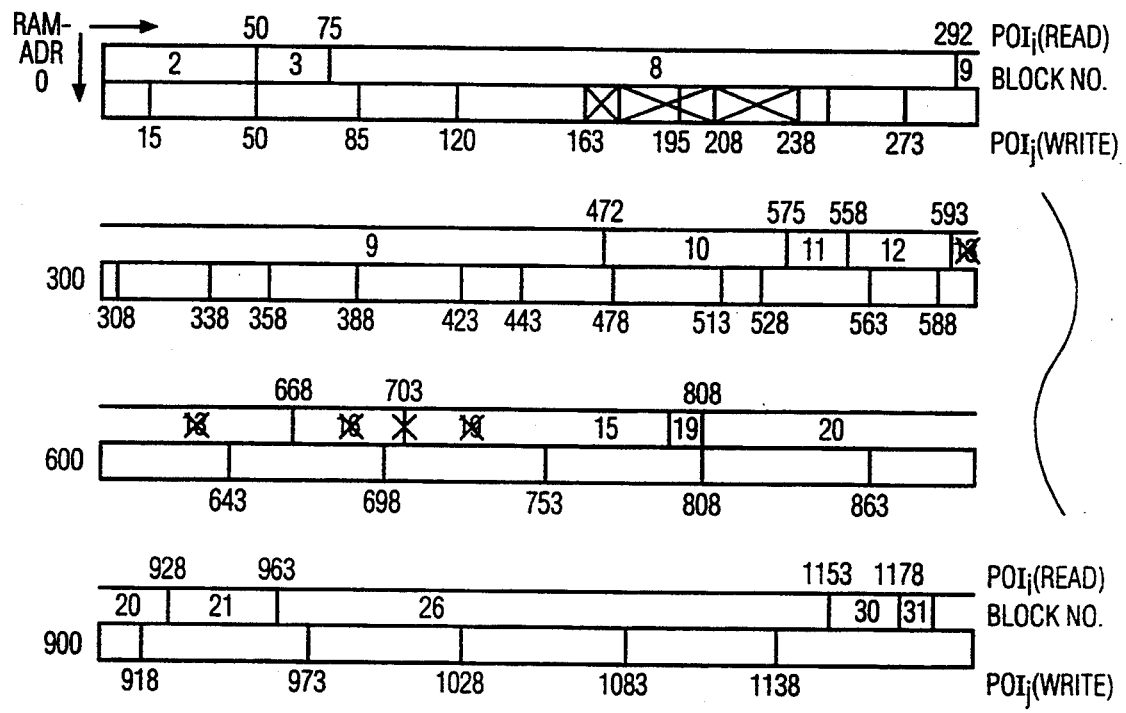
FIG. 12 depicts data in dual port RAMV A R 10 (FIG. 4) in the case of faults.

FIG. 11 and FIG. 12 illustrate the values for the fault case corresponding to the relationships in FIG. 7 and FIG. 8, respectively. Fault locations are crossed through. As faults first appear after coding, FIG. 7 and FIG. 11 contain the same values.

We claim:

1. In a digital data processing system, encoding apparatus to facilitate data reconstitution at a decoder, comprising:

first means responsive to digital data for providing encoded variable length data blocks having an average length and subject to containing a DC component representing the mean value of a block of transform coefficients and an AC component representing remaining transform coefficients of said blocks and associated addresses;

second means responsive to said data blocks for providing transport blocks of prescribed length, said transport blocks comprising said variable length data blocks or segments thereof so as to constitute a full transport block; and third means for providing to said transport blocks memory address information including an address flag and an address pointer to facilitate the reconstitution at a decoder of data block segments associated with data blocks having a length greater than said average length: wherein said address flag indicates whether or not a transport block contains data from segmented data blocks having a length greater than said average length; and said address pointer indicates the location up to which data is written into and read out from a memory device.

2. Apparatus according to claim 1, wherein
   said second means includes a memory;
   said address flag indicates whether or not a given data block is longer or shorter than said average length; and
   said address pointer indicates (a) up to which address said memory has been written to with data for a given data block, and (b) up to which address data belonging to other data blocks is read out from said memory for a given data block having a length shorter than said average length.

3. Apparatus according to claim 1, wherein
   said digital data comprises Discrete Cosine Transform (DCT) coefficients.

4. Apparatus according to claim 1 and further including
   means for providing to said blocks information indicating the type of DCT processing associated with respective blocks.

5. Apparatus according to claim 1, wherein
   said second means comprises (a) a multiplexer responsive to variable length data from said first means for providing output variable length data blocks and data block segments constituting said transport blocks; (b) memory means for storing said data blocks and said data block segments from said multiplexer at respective addresses; and (c) means coupled to said memory means and to said analysis means for formatting data so as to constitute a transport block; and wherein
   said third means comprises analysis means, coupled to said memory means and to said multiplexer, for generating said address pointer and said address flag.

6. In a digital data processing system, decoder apparatus responsive to a data stream comprising transport blocks of prescribed length containing a DC component representing the mean value of a block of transform coefficients and AC components representing remaining transform coefficients of said blocks and associated addresses, said transport blocks comprising variable length data blocks and segments thereof, said transport blocks also containing an address flag and an address pointer providing memory address information to facilitate the reconstitution of data block segments associated with data blocks having a length greater than an average data block length, wherein said address flag indicates whether or not a transport block contains segmented data from said data blocks having a length greater than said average length and said address pointer indicates the location up to which data is written into and read out from a memory device; said apparatus comprising:

first means responsive to said data stream for decoding address flag and address pointer information;

second means responsive to output information from said first means for providing reconstituted variable length data blocks derived from more than one transport block; and variable length decoder means for decoding said reconstituted data blocks.

7. Apparatus according to claim 6, wherein said second means includes address pointer calculation means responsive to said address flag and address pointer information;

a multiplexer responsive to said first means for providing output variable length data blocks and data block segments constituting said transport blocks;

memory means responsive to output information from said calculating means and to output data from said multiplexer for storing said data blocks and said data block segments from said multiplexer at respective addresses; and means responsive to output information from said calculating means for combining associated block data from said memory means to provide said reconstituted data blocks.

8. Apparatus according to claim 6, wherein said address flag indicates whether a given transport block contains a data block which is longer or shorter than an average data block length; and said address pointer specifies read/write memory addresses with respect to data block segments within a given transport block.

9. Apparatus according to claim 8, wherein said second means comprises first and second memory memories for respectively storing fixed length and residual variable length data; and said address pointer specifies addresses up to which data is written into and read out from said second memory device.

* * * * *